United States Patent [19]
Terauchi

[11] Patent Number: 6,120,834
[45] Date of Patent: Sep. 19, 2000

[54] APPARATUS FOR FORMING FILM AND METHOD FOR FORMING FILM

[75] Inventor: Ken-ichi Terauchi, Hikone, Japan

[73] Assignee: Dainippon Screen Mfg. Co., Ltd., Japan

[21] Appl. No.: 08/807,321

[22] Filed: Feb. 27, 1997

[30] Foreign Application Priority Data

Feb. 29, 1996 [JP] Japan ..................... 8-042921

[51] Int. Cl.[7] ............... B05D 5/12; B05C 13/02; B05B 13/04
[52] U.S. Cl. .............. 427/96; 427/398.4; 427/377; 118/323; 118/320; 118/500
[58] Field of Search ................. 118/500, 504, 118/52, 320, 323, 64, 50; 427/96, 398.4, 374.6, 377, 350, 140; 134/200, 902

[56] References Cited

U.S. PATENT DOCUMENTS

| | | | |
|---|---|---|---|
| 4,696,885 | 9/1987 | Vijan .................... | 430/311 |
| 4,858,558 | 8/1989 | Ohmura et al. ............ | 118/725 |
| 5,569,350 | 10/1996 | Osada et al. ............. | 118/500 |
| 5,591,362 | 1/1997 | Sago et al. .............. | 118/52 |

FOREIGN PATENT DOCUMENTS

| | | |
|---|---|---|
| 3-101866 | 4/1991 | Japan . |
| 7-283108 | 10/1995 | Japan . |
| 8-024740 | 1/1996 | Japan . |

*Primary Examiner*—Laura Edwards
*Assistant Examiner*—George R. Koch, III
*Attorney, Agent, or Firm*—Ostrolenk, Faber, Gerb & Soffen, LLP

[57] ABSTRACT

An apparatus for forming a film includes a substrate stage, a slit coater and a chamber lid. The substrate stage holds a substrate and defines a lower chamber of an openable low pressure chamber. A treatment solution feed applies the film onto the surface of the substrate held on the substrate stage when the chamber lid (3) is open. The chamber lid defines the low pressure chamber with the substrate stage (1). In the low pressure chamber, the film applied onto the surface of the substrate is subjected to drying by reducing the pressure in the chamber when the chamber lid is closed. Furthermore, according to a method for forming the film, immediately after the film has been applied onto the substrate, the thus applied film is subjected to low pressure drying at the position where the film has been applied.

54 Claims, 4 Drawing Sheets

APPARATUS FOR FORMING FILM AND METHOD FOR FORMING FILM

BACKGROUND OF THE INVENTION (i) Field of the Invention

The present invention relates to an apparatus for forming a film and a method for forming the film, and more specifically, it relates to an apparatus for forming a film by applying the film on the surface of a substrate and then drying this film, and a method for forming the film.

(ii) Description of the Related Art

In the coating of a photoresist film used in a photolithography technique, a spin coater can usually be used. The spin coater spins a substrate after a coating solution has been fed onto the surface of the substrate, and from the coating solution spread all over the surface of the substrate by this spin, the photoresist film can be formed. The thus obtained photoresist film can be applied onto the surface of a substrate such as the glass substrate of a liquid crystal display, a printed circuit board, a semiconductor substrate, the glass substrate of a photomask or a ceramic substrate for use in the manufacture of a thermal head. This photoresist film can be subjected to various treatments such as a drying treatment, an exposure treatment, a developing treatment and a washing treatment to form a pattern such as a conductive pattern or an insulating pattern on the surface of the substrate.

With the enlargement of liquid crystal displays, the size of substrates has also increased, but this increase in size has been to the intent that it is difficult to form the photoresist film by the spinning treatment using the spin coater. Consequently, in recent years, a film applicator called a slit coater has been developed. The slit coater has a slit nozzle which can move within a specific width on the surface of the substrate, and this slit coater can apply the photoresist film within the specific width on the surface of the substrate while moving. In short, the slit coater is characterized by being able to apply the photoresist film having a desired film thickness at one action.

In general, the photoresist film applied by the slit coater is in a wet state, and the substrate with this wet film can then be delivered to a vacuum drying device in a next step, in which the photoresist film can be dried under the low pressure conditions in this low pressure drying device. For the delivery of the substrate from the slit coater to the low pressure drying device, a robot can be used for the purpose of automatic delivery, and in this case, the substrate can be gripped by a hand of the robot and then delivered.

The photoresist film applied by the slit coater is in the wet state, so that the hand of the robot comes in contact with the wet photoresist film formed on the substrate. A trace of the hand remains on the photoresist film, or the thickness of the photoresist film alters owing to a difference of temperature between both the members. The damage of the photoresist film which is brought about at the time of the delivery by the robot can be previously avoided by forming a holding region on the surface of the substrate.

In the case where a rectangular substrate, having the length of its one side is in the range of 200 to 700 mm, is used as the glass substrate of the liquid crystal display, and in the case where the above-mentioned slit coater is used, a photoresist film-free region having a width of 2 to 5 m from the edge toward the center of the substrate surface is required to remain along the periphery of the substrate surface. This region is the holding region in which the substrate can be gripped by the hand of the robot.

However, there has been a tendency for a substrate such as the glass substrate which can be used in the above-mentioned liquid crystal display to be enlarged, and the effective region in which the pattern can actually be formed on the surface of the substrate by the photolithography technique is required to be as large as possible. However, the formation of the above-mentioned holding region makes the acquisition of a sufficiently effective area impossible. If the holding region is limited, the handling of the substrate by the hand of the robot is difficult and some restriction is put on the handling of the substrate at the time of delivery. Thus the delivery of the substrate cannot be carried out smoothly, with the result that the productivity of the substrates deteriorates disadvantageously.

Furthermore, the substrate on which the wet photoresist film has been applied by the slit coater is delivered to the low pressure drying device in the next step by the robot as the substrate delivery device. Therefore, the slit coater and the low pressure drying device are separately installed on a substrate treatment plant line, and this fact disadvantageously results in the enlargement of the substrate treatment plant line.

SUMMARY OF THE INVENTION

The present invention has been developed with the intention of solving the above-mentioned problems. Thus, an object of the present invention is to provide an apparatus for forming a film which permits the miniaturization of the apparatus. Another object of the present invention is to provide a method for forming the film by which the handling of a substrate can be carried out smoothly and its productivity can be improved.

In order to solve the above-mentioned problems, the present invention is directed to an apparatus for forming a film on the surface of a substrate which comprises a substrate holding portion for holding the substrate, a treatment solution feed means including a nozzle having a treatment solution feed orifice extending in one direction for feeding a treatment solution onto the surface of the substrate while relatively moving along the surface of the substrate held on the substrate holding portion, a chamber for sealing the substrate held on the substrate holding portion together with a space on the side of the substrate surface, and a pressure reducing means for reducing the pressure in the chamber.

In the apparatus for forming a film according to the present invention the substrate holding portion can hold the substrate at an inclined posture.

The present invention may further comprise a substrate stopper for preventing the substrate from dropping from the substrate holding portion when the pressure in the chamber is reduced by the pressure reducing means.

The present invention may also be directed to an apparatus for forming a film which has an openable chamber lid for defining the chamber with the substrate holding portion in a closing state.

The present invention is also directed to a method for forming a film on the surface of a substrate, where the method comprises a treatment solution application step of feeding a treatment solution in a belt form onto the surface of the substrate held on a substrate holding portion to apply the treatment solution substantially all over the surface of the substrate, a chamber defining step of defining a chamber for sealing the substrate held on the substrate holding portion together with a space on the side of the substrate surface, and a low pressure drying step of reducing the pressure in the chamber to dry the treatment solution applied onto the surface of the substrate.

In the method of the present invention the treatment solution application step can be carried out while the substrate is held in an inclined posture by the substrate holding means.

DETAILED DESCRIPTION OF THE PREFERRED EMBODIMENTS

Embodiment 1

Figure 1:
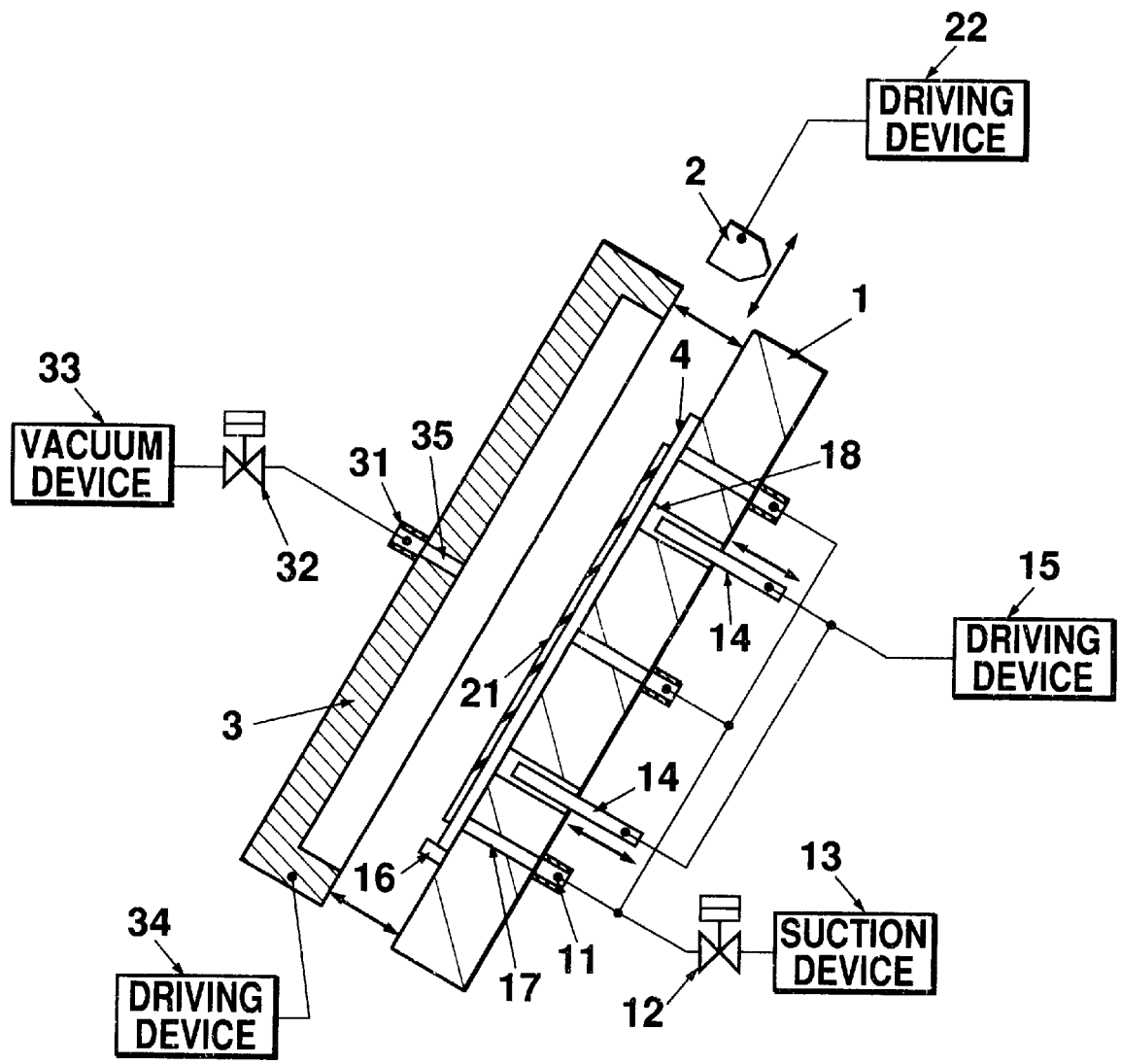
FIG. 1 is a schematic view of a vertical apparatus for forming a film according to Embodiment 1 of the present invention.

Next an Embodiment 1 of the present invention will be described. FIG. 1 is a schematic view of a vertical apparatus for forming a film regarding Embodiment 1 of the present invention. As shown in FIG. 1, the vertical apparatus for forming the film is equipped with a substrate stage 1, a slit coater 2 and a chamber lid 3.

On the substrate stage 1 of the vertical apparatus for forming the film, a substrate 4 is mounted and held. In this embodiment, the substrate stage 1 is held at an inclined posture by an apparatus body frame, not shown. Substrate stage 1 can hold the substrate 4 at an inclined posture in a range from a horizontal posture to a vertical state (inclusive of the vertical posture). In this embodiment, a glass substrate which has been used in a liquid crystal display is used as the substrate 4. Furthermore, as the substrate 4, there can be used a printed circuit board, a semiconductor substrate, a glass substrate of a photomask or a ceramic substrate for use in the manufacture of a thermal head.

The substrate stage 1 is provided with a plurality of suction orifices 17 and a plurality of lift pin guide orifices 18, both of which pass through the substrate stage 1 in its thickness direction. The suction orifices 17 are connected to a suction device 13 through a suction pipe 11 and a valve 12. The substrate 4 mounted on the surface of the substrate stage 1 is held by suction on the surface of the substrate stage 1 by a vacuum of the suction device 13.

The lift pin guide orifices 18 are formed separately from the suction orifices 17, and these lift pin guide orifices 18 can guide lift pins 14 in a direction crossing the surface of the substrate stage 1 at right angles. The lift pins 14 are connected to a lift pin driving device 15 for driving these lift pins 14 in the direction crossing the surface of the substrate stage 1 at right angles. The upper tips of the lift pins 14 can upwardly protrude from the surface of the substrate stage 1 and can also be downwardly retracted from the surface by the lift pin driving device 15. That is to say, the lift pins 14 can push up from the back surface of the substrate stage 1, and the substrate 4 closely held by suction on the surface of the substrate stage 1 is detached from the surface of the substrate stage 1. Instead of lift pin driving device 15, there can be used, for example, a linearly movable driving device such as an air pressure cylinder, a motor, or another driving device equipped with a conversion mechanism for converting the rotational movement of the motor into an upward/downward movement.

At a lower position on the surface of the substrate stage 1, a substrate stopper 16 is arranged, and this substrate stopper 16 can prevent dropping of the substrate 4 mounted and held on the substrate stage 1 in an inclined posture. In particular, the substrate stopper 16 can be effective in the case where the pressure in a low pressure chamber, hereinafter described, is reduced so that a pressure difference between the pressure in the low pressure chamber and the pressure in the suction orifices 17 decreases, so that the suction holding of the substrate 4 cannot be maintained any more. The substrate stopper 16 can be formed from a pin, a plate member or the like.

Furthermore, the substrate stage 1 defines a lower chamber of the low pressure chamber, and the substrate stage 1 defines the openable low pressure chamber together with a chamber lid 3. In this embodiment, the substrate stage 1 for defining the lower chamber is fixed to the frame of an apparatus body, and the chamber lid 3 can move in a direction crossing the surface of the substrate stage 1 at right angles to permit the opening/closing operation of the low pressure chamber.

The slit coater 2 has a slit nozzle having a photoresist feed orifice extending in one direction. The slit coater 2 feeds a photoresist as a film 21 onto the surface of the substrate 4 mounted and held on the substrate stage 1 in the inclined posture to apply this photoresist film 21 thereonto. The slit coater 2 is connected to a coater driving device 22, and this slit coater 2 applies the photoresist film 21 having a desired film thickness onto the surface of the substrate 4 in one action while moving from the upper side to the lower side of the substrate 4 over the surface of the substrate 4 by means of the coater driving device 22. The photoresist film 21 just applied by the slit coater 2 is in a wet state. Instead of the slit coater 2, there can be used a coater which can move right and left on the surface of the substrate 4 mounted and held on the surface of the substrate stage 1.

The chamber lid 3 can define the openable low pressure chamber together with the substrate stage 1 which can also be used as the lower chamber, as described above. The chamber lid 3 is connected to a chamber driving device 34 which can move the chamber lid 3 in the direction crossing the surface of the substrate stage 1 at right angles to permit the opening/closing operation of the low pressure chamber. As the chamber driving device 34, a driving device such as the same air pressure cylinder as described above can be used. The chamber lid 3 is provided with a vacuum orifice 35 formed through the chamber lid 3 in its thickness direction, and this vacuum orifice 35 is connected to a vacuum device 33 through a vacuum pipe 31 and a valve 32. The vacuum device 33 can reduce the pressure in the closed low pressure chamber defined by the substrate stage 1 and the chamber lid 3. In the low pressure chamber, the wet photoresist film 21 applied onto the surface of the substrate 4 is dried under a reduced pressure.

Next, a method for forming the film by the use of the above-mentioned vertical apparatus for forming the film will be described. FIGS. 2 to 5 show schematic views of the apparatus for forming the film in several steps.

Figure 2:
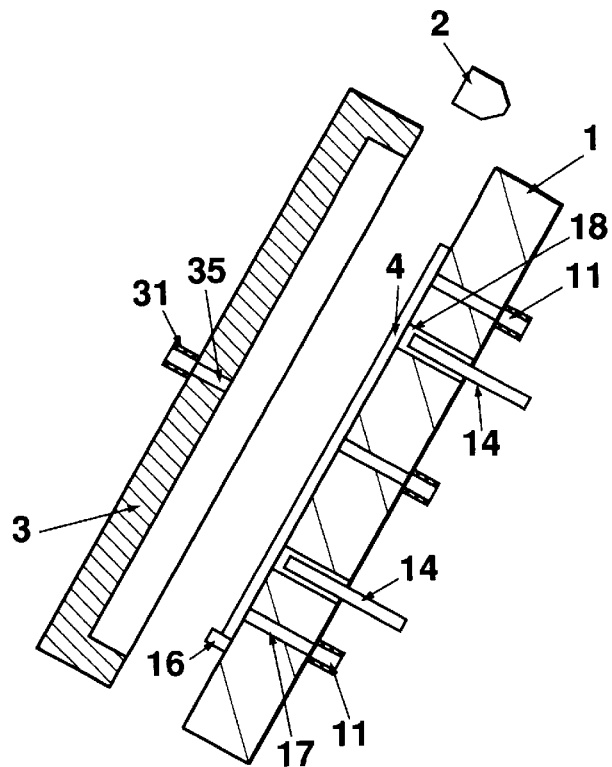
FIG. 2 is a schematic view of the vertical apparatus for forming the film in accordance to a first step which explains a method for forming the film.

(1) In the first place, as shown in FIG. 2, when the low pressure chamber defined by the substrate stage 1 and the chamber lid 3 is opened, the substrate 4 is mounted and held on the surface of the substrate stage 1 in the inclined posture, whereby this substrate 4 is held on the substrate stage 1. The mounting of the substrate 4 can be automatically carried out by a robot for substrate delivery not shown. The substrate 4 can be held by the above-mentioned suction device 13 shown in FIG. 1.

Figure 3:
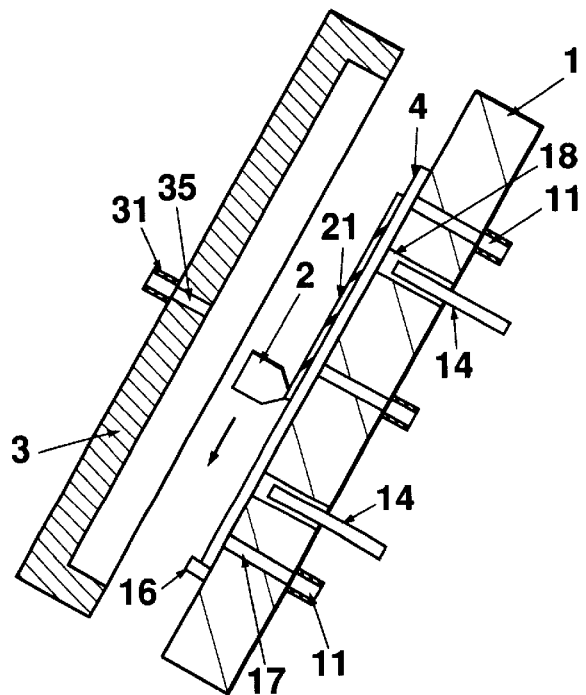
FIG. 3 is a schematic view of the vertical apparatus for forming the film in accordance to a second step.

(2) As shown in FIG. 3, when the low pressure chamber is opened, the photoresist film 21 is applied, by the slit coater 2, onto the surface of the substrate 4, which is mounted and held on the substrate stage 1 in the inclined state. The slit coater 2 applies the photoresist film 21 having a desired film thickness onto the surface of the substrate 4 at one action while moving from the upper side to the lower side of the substrate 4 over the surface of the substrate 4 by means of the coater driving device 22 shown in FIG. 1. At this time, the photoresist film 21 can be applied in a belt form substantially all over the surface of the substrate 4. The photoresist film 21 just applied is in a wet state.

Figure 4:
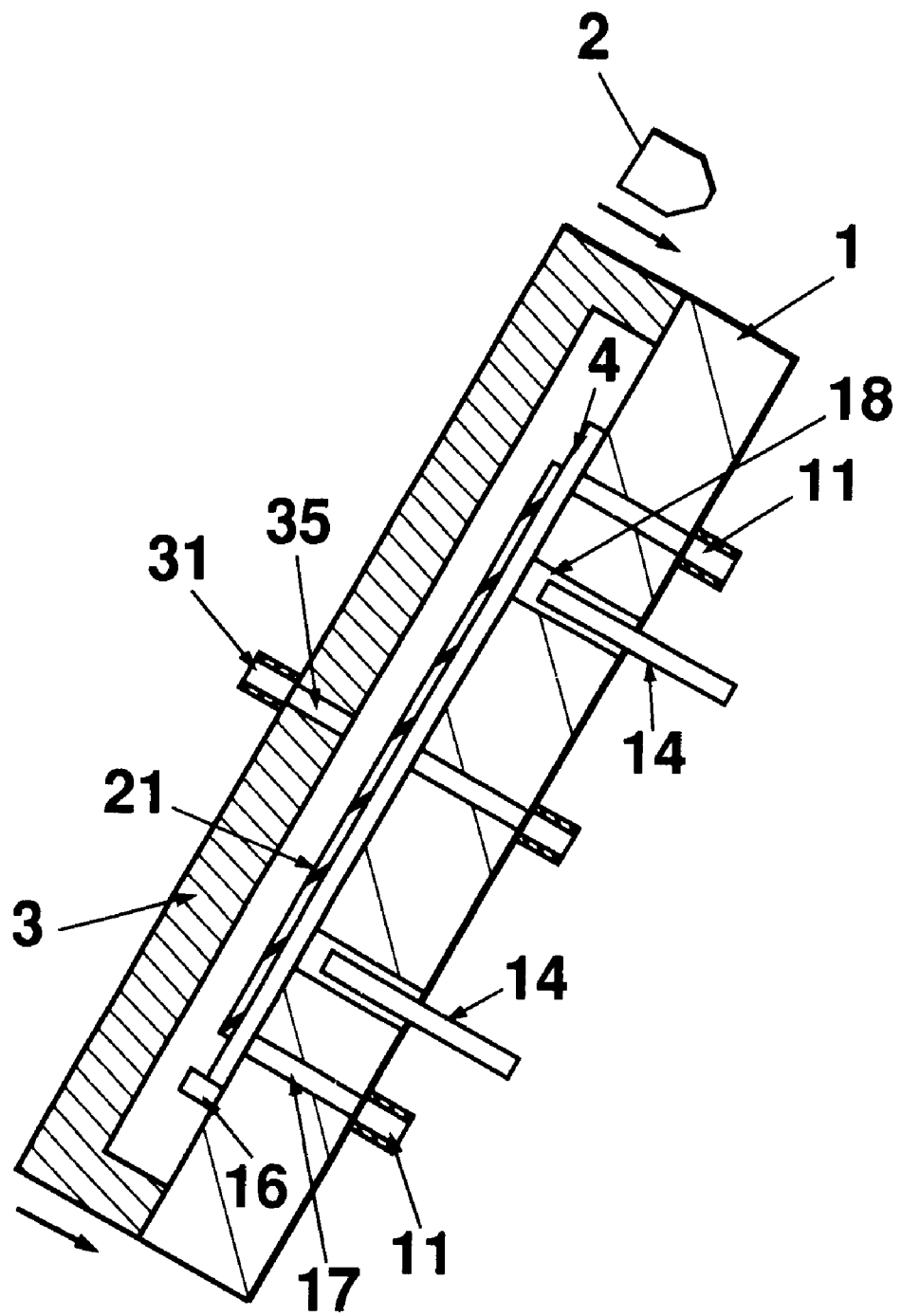
FIG. 4 is a schematic view of the vertical apparatus for forming the film in accordance to a third step.

(3) When the slit coater 2 has returned to a waiting position, the chamber lid 3 afterward moves toward the surface of the substrate stage 1, as shown in FIG. 4, and chamber hits against the surface of the substrate stage 1, whereby the low pressure chamber is closed and the interior in the low pressure chamber is maintained in an airtight state. The substrate 4, which is in the wet state and which is held on the substrate stage 1 in the inclined posture, is in the low pressure chamber as is. The movement of the chamber lid 3, i.e., the closing of the low pressure chamber, can be carried out by the above-mentioned chamber driving device 34 shown in FIG. 1. Then, the pressure in the low pressure chamber is reduced by the vacuum device 33 shown in FIG. 1, whereby the photoresist film 21 applied on the surface of the substrate 4 is subjected to a drying treatment so that low pressure drying of the photoresist film 21 is carried out.

At this time, the pressure in the low pressure chamber is reduced and a pressure difference between the pressure in the low pressure chamber and the pressure (vacuum pressure) in the suction orifices 17 decreases, so that there is a decrease in the suction force by which the substrate 4 is held. However, since the substrate stage 1 is provided with the substrate stopper 16, the substrate 4 does not drop from the substrate stage 1.

Figure 5:
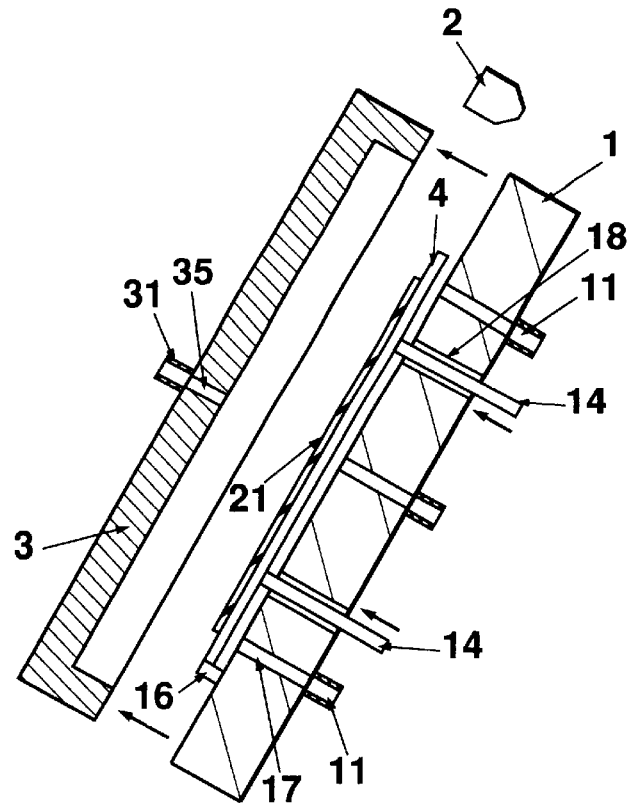
FIG. 5 is a schematic view of the vertical apparatus for forming the film in accordance to a fourth step.

(4) Next, as shown in FIG. 5, the chamber lid 3 moves to open the low pressure chamber. The substrate 4 is closely held by suction on the surface of the substrate stage 1, and therefore the lift pins 14 protrude from the surface of the substrate stage 1 to push up the back surface of the substrate 4, thereby detaching the substrate 4 from the surface of the substrate stage 1. Afterward, the substrate 4 is gripped by the hand of the robot for substrate delivery, not shown, and then delivered to a treatment device in the next step.

As understood from the above, in the vertical apparatus for forming the film regarding the present embodiment, the slit coater 2 and the low pressure chamber (the substrate stage 1 for defining the lower chamber and the chamber lid 3) are arranged in substantially one space, and after the photoresist film 21 has been applied onto the surface of the substrate 4 by the slit coater 2, the low pressure drying treatment of the photoresist film 21 is carried out at this position where the application of the photoresist film 21 has been made. Therefore, the miniaturization of the vertical apparatus for forming the film can be realized. In addition, since the vertical apparatus for forming the film employs the constitution where the substrate 4 is held on the substrate stage 1 in the inclined posture, the occupational area of the whole apparatus can be reduced, whereby a further miniaturization can be achieved.

Moreover, in the vertical apparatus for forming the film, the drying of the photoresist film 21 can be done at the same position where the photoresist film 21 has been applied onto the substrate 4, and therefore the damage of the photoresist film 21 which is brought about at the delivery of the substrate 4 can be decreased and the substrate 4 can be easily handled. Accordingly, the delivery of the substrate 4 can be smoothly carried out, which leads to the improvement of productivity. After the photoresist film 21 has been dried, the photoresist film 21 is scarcely damaged by handling.

Embodiment 2

Figure 6:
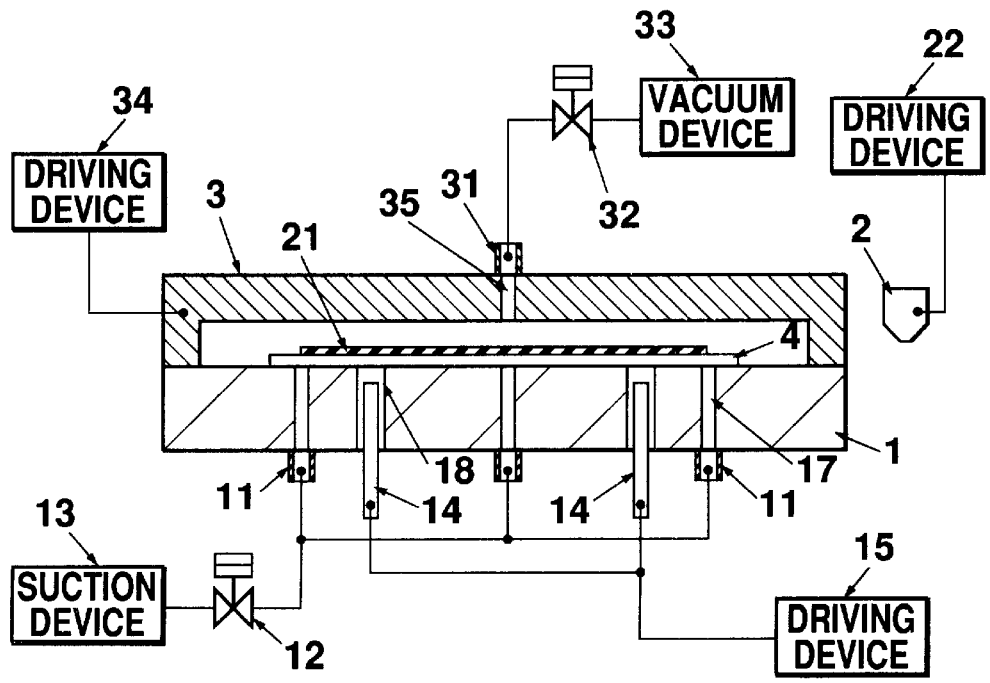
FIG. 6 is a schematic view of the horizontal apparatus for forming the film according to Embodiment 2 of the present invention.

In Embodiment 2, a horizontal apparatus for forming a film will be described. FIG. 6 is a schematic view of the horizontal apparatus for forming the film regarding Embodiment 2 of the present invention. The fundamental structure of the horizontal apparatus for forming the film shown in FIG. 6 is the same as in the above-mentioned vertical apparatus for forming the film, but the horizontal apparatus is different from the vertical apparatus in that substrate 4 is held in horizontal posture. That is to say, in the horizontal apparatus, the substrate 4 is mounted and held on the substrate stage 1 in a horizontal posture, and the slit coater 2 applies the photoresist film 21 on the surface of the substrate 4 held in the horizontal posture, and the chamber lid 3 moves upwardly and downwardly to the surface of the substrate stage 1 to open/close the low pressure chamber.

As explained above, a substrate holding portion for mounting and holding the substrate can define a part of the low pressure chamber, and the film can be applied onto the surface of the substrate, while this substrate is mounted and held on the substrate holding portion. In addition, the drying of the applied film can be carried out at the same position where this film has been applied. Therefore, a treatment solution feed means and a low pressure chamber can be arranged in one space, whereby miniaturization of the apparatus for forming the film can be accomplished.

The film can be applied onto the surface of the substrate and the film can be subjected to low pressure drying while the substrate is held in an inclined posture, and therefore the substrate holding portion, the treatment solution feed means and a chamber lid can be arranged together in a limited area. Thus, the arrangement area for these members can be reduced, which permits a further miniaturization of the apparatus for forming the film.

According to the invention described in claim 3, the substrate held on the substrate holding portion in the inclined posture can be prevented from dropping therefrom during a low pressure drying treatment.

The film can be applied, by the treatment solution feed means, onto the surface of the substrate mounted and held on the substrate holding portion, and immediately after this application, the film applied onto the surface of the substrate can be subjected to low pressure drying. Therefore, the substrate having the dried film can be handled. In consequence, the substrate can be smoothly delivered, which can lead to the improvement of productivity.

Although the present invention has been described in relation to particular embodiments thereof, many other variations and modifications and other uses will become apparent to those skilled in the art. It is preferred, therefore, that the present invention be limited not by the specific disclosure therein, but only by the appended claims.

What is claimed is:

1. A method for forming a film on the surface of a substrate, said method comprising the steps of:

applying a wet film to a surface of a substrate while the substrate is held in place by a support member;

forming a vacuum chamber around said substrate while said substrate is held in place by said support member and while said film is still wet, said vacuum chamber being defined primarily by said support member and a chamber lid; and thereafter using said vacuum chamber to dry said film by applying a vacuum to said film.

2. A method according to claim 1, wherein said support member forms part of said vacuum chamber.

3. A method according to claim 1, wherein said step of applying a wet film to said surface of said substrate is carried out using a slit coater.

4. A method according to claim 3, wherein said slit coater applies said wet film to said surface while moving across said surface.

5. A method according to claim 4, wherein said slit coater applies said wet film to said surface in a single pass of said slit coater across said surface.

6. A method according to claim 1, wherein said substrate is maintained in an inclined position while said wet film is applied to said surface of said substrate.

7. A method according to claim 6, wherein said substrate is also maintained in an inclined position during said drying step.

8. A method according to claim 1, wherein said vacuum chamber is a generally parallelpiped chamber and said support member forms one wall thereof.

9. A method according to claim 1, wherein said wet film is applied to the entirety of said surface.

10. A method according to claim 1, wherein said vacuum chamber is formed around said substrate without moving said substrate.

11. A method according to claim 1, wherein said surface of said substrate is the entire top surface of said substrate and said support member supports said substrate without touching said top surface.

12. A method according to claim 11, wherein said substrate is supported on said support member by suction.

13. A method for forming a film on the surface of a substrate, said method comprising the steps of:

applying a wet film to a surface of a substrate while the substrate is held in place by a support member;

situating said substrate in a vacuum chamber while said film is still wet without touching any portion of said surface of said substrate, said vacuum chamber being defined primarily by said support member and a chamber lid; and thereafter using said vacuum chamber to dry said film by applying a vacuum to said film.

14. A method for forming a film on the surface of a substrate according to claim 13, wherein said step of situating said substrate in a vacuum chamber comprising the step of forming a vacuum chamber around said substrate while said substrate is held in place by said support member and while said film is still wet.

15. A method according to claim 14, wherein said vacuum chamber is formed around said substrate without moving said substrate.

16. A method according to claim 13, wherein said support member forms part of said vacuum chamber.

17. A method according to claim 13, wherein said step of applying a wet film to said surface of said substrate is carried out using a slit coater.

18. A method according to claim 17, wherein said slit coater applies said wet film to said surface while moving across said surface.

19. A method according to claim 18, wherein said slit coater applies said wet film to said surface in a single pass of said slit coater across said surface.

20. A method according to claim 13, wherein said substrate is maintained in an inclined position while said wet film is applied to said surface of said substrate.

21. A method according to claim 20, wherein said substrate is also maintained in an inclined position during said drying step.

22. A method according to claim 13, wherein said vacuum chamber is a generally parallelpiped chamber and said support member forms one wall thereof.

23. A method according to claim 13, wherein said wet film is applied to the entirety of said surface.

24. A method according to claim 13, wherein said surface of said substrate is the entire top surface of said substrate and said support member supports said substrate without touching said top surface.

25. A method according to claim 24, wherein said substrate is supported on said support member by suction.

26. Apparatus for forming a film on the surface of a substrate, said apparatus comprising:

a support member supporting said substrate;

a film coater which applies a wet film to a surface of said substrate while the substrate is held in place by said support member; and means for forming a vacuum chamber around said substrate for drying said wet film, said vacuum chamber being formed around said substrate while said substrate is held in place by said support member and while said film is still wet, said vacuum chamber being defined primarily by said support member and a chamber lid.

27. Apparatus according to claim 26, wherein said support member forms part of said vacuum chamber.

28. Apparatus according to claim 26, wherein said film coater is a slit coater.

29. Apparatus according to claim 28, wherein said slit coater applies said wet film to said surface while moving across said surface.

30. Apparatus according to claim 29, wherein said slit coater applies said wet film to said surface in a single pass of said slit coater across said surface.

31. Apparatus according to claim 26, wherein said support member supports said substrate in an inclined position while said wet film is applied to said surface of said substrate.

32. Apparatus according to claim 31, wherein said support member also supports said substrate in an inclined position while said wet film is dried in said vacuum chamber.

33. Apparatus according to claim 26, wherein said chamber lid is moved between an open position removed from said support member by a sufficient distance that said film coater can place said film on said surface of said substrate without interference from said chamber lid and a closed position wherein said chamber lid and said support member cooperate to define at least part of said vacuum chamber.

34. Apparatus according to claim 33, wherein said vacuum chamber is a generally parallelpiped chamber and said support member forms one wall thereof.

35. Apparatus according to claim 26, wherein said vacuum chamber is a generally parallelpiped chamber and said support member forms one wall thereof.

36. Apparatus according to claim 26, wherein said film applicator applies said wet film to the entirety of said surface.

37. Apparatus according to claim 26, wherein said vacuum chamber is formed around said substrate without moving said substrate.

38. Apparatus according to claim 37, wherein said surface is the entire top surface of said substrate and said support member supports said substrate without touching said top surface.

39. Apparatus according to claim 38, wherein support member supports said substrate by suction.

40. Apparatus for forming a film on the surface of a substrate, said apparatus comprising:
- a support member;
- a film applicator which applies a wet film to a surface of said substrate while said substrate is held in place by said support member;
- structure which situates said substrate in a vacuum chamber for drying said wet film, said structure situating said substrate in said vacuum chamber while said film is still wet and without touching any portion of said surface of said substrate, said vacuum chamber being defined primarily by said support member and a chamber lid.

41. Apparatus for forming a film on the surface of a substrate according to claim 40, wherein said situating structure forms said vacuum chamber around said substrate while said substrate is held in place by said support member and while said film is still wet.

42. Apparatus according to claim 40, wherein said support member forms part of said vacuum chamber.

43. Apparatus according to claim 40, wherein said film applicator is a slit coater.

44. A apparatus according to claim 43, wherein said slit coater applies said wet film to said surface while moving across said surface.

45. Apparatus according to claim 44, wherein said slit coater applies said wet film to said surface in a single pass of said slit coater across said surface.

46. Apparatus according to claim 40, wherein said support member maintains said substrate in an inclined position while said wet film is applied to said surface of said substrate.

47. Apparatus according to claim 46, wherein said support member also maintains said substrate in an inclined position while said wet film is dried in said vacuum chamber.

48. Apparatus according to claim 40, wherein said chamber lid is moved between an open position removed from said support member by a sufficient distance that said film coater can place said film on said surface of said substrate without interference from said chamber lid and a closed position wherein said chamber lid and said support member cooperate to define at least part of said vacuum chamber.

49. A apparatus according to claim 48, wherein said vacuum chamber is a generally parallelpiped chamber and said support member forms one wall thereof.

50. A apparatus according to claim 40, wherein said vacuum chamber is a generally parallelpiped chamber and said support member forms one wall thereof.

51. A apparatus according to claim 40, wherein said wet film is applied to the entirety of said surface.

52. A apparatus according to claim 40, wherein said vacuum chamber is formed around said substrate without moving said substrate.

53. Apparatus according to claim 40, wherein said surface is the entire top surface of said substrate and said support member supports said substrate without touching said top surface.

54. Apparatus according to claim 53, wherein support member supports said substrate by suction.

* * * * *